US012672473B2

(12) United States Patent
Liu et al.

(10) Patent No.: US 12,672,473 B2
(45) Date of Patent: Jun. 30, 2026

(54) DISPLAY DEVICE

(71) Applicant: AUO Corporation, Hsin-Chu (TW)

(72) Inventors: Shu-Jiang Liu, Hsin-Chu (TW);
Yang-Pei Hu, Hsin-Chu (TW);
Chun-Cheng Hung, Hsin-Chu (TW)

(73) Assignee: AUO CORPORATION, Hsin-Chu
(TW)

( * ) Notice: Subject to any disclaimer, the term of this
patent is extended or adjusted under 35
U.S.C. 154(b) by 467 days.

(21) Appl. No.: 18/517,014

(22) Filed: Nov. 22, 2023

(65) Prior Publication Data

US 2025/0048897 A1 Feb. 6, 2025

(30) Foreign Application Priority Data

Aug. 4, 2023 (TW) .................................. 112129448

(51) Int. Cl.
*H10K 59/80* (2023.01)
*H10K 59/35* (2023.01)
*H10K 59/173* (2023.01)

(52) U.S. Cl.
CPC ........... *H10K 59/879* (2023.02); *H10K 59/35*
(2023.02); *H10K 59/8731* (2023.02); *H10K*
*59/173* (2023.02)

(58) Field of Classification Search
CPC .. H10K 59/879; H10K 59/35; H10K 59/8731;
H10K 59/173; H10K 50/856; H10K
50/858; H10K 59/878
See application file for complete search history.

(56) References Cited

U.S. PATENT DOCUMENTS

| | | | | |
|---|---|---|---|---|
| 8,076,844 B2 * | 12/2011 | Oda | ..................... | H10K 59/122 |
| | | | | 313/506 |
| 11,069,759 B2 * | 7/2021 | Kim | ..................... | H10K 59/873 |
| 2018/0083218 A1 * | 3/2018 | Choi | .................... | H10K 59/878 |
| 2019/0258346 A1 | 8/2019 | Cheng et al. | | |
| 2021/0057498 A1 | 2/2021 | Pahk et al. | | |
| 2024/0147768 A1 * | 5/2024 | Han | ..................... | H10K 59/122 |

FOREIGN PATENT DOCUMENTS

CN 111180603 A 5/2020

* cited by examiner

*Primary Examiner* — Kevin Quarterman
(74) *Attorney, Agent, or Firm* — WPAT, PC

(57) ABSTRACT

A display device includes a substrate, subpixel units and a
thin film encapsulation structure. The subpixel units are
disposed on the substrate, and each of the subpixel units
includes a light emitting part and a pixel defining part
surrounding the light emitting part. The thin film encapsu-
lation structure covers the subpixel units, and includes a first
encapsulation layer and a second encapsulation layer cov-
ering and in contact with the first encapsulation layer. The
refractive index of the first encapsulation layer is different
from that of the second encapsulation layer. The first encap-
sulation layer includes first microstructures, and the first
microstructures are respectively disposed on the pixel defin-
ing parts. The second encapsulation layer includes second
microstructures, the second microstructures are respectively
disposed on the pixel defining parts, and the second micro-
structures are respectively fitted with the first microstruc-
tures to form distributed Bragg reflectors.

20 Claims, 5 Drawing Sheets

M1

M1

DISPLAY DEVICE

CROSS-REFERENCE TO RELATED APPLICATION

This application claims priority to Taiwan Application Serial Number 112129448, filed Aug. 4, 2023, which is herein incorporated by reference in its entirety.

BACKGROUND

Field of Invention

The present disclosure relates to a display device. More particularly, the present disclosure relates to a display device including a distributed Bragg reflector (DBR).

Description of Related Art

Organic light emitting diode (OLED) display devices have the advantages of self-illumination, wide viewing angle, and fast response time. However, applications in augmented reality (AR) or virtual reality (VR) often require highly directional light sources, and the light pattern of organic light emitting diode display devices tends to be flat plate type, so the light pattern is mismatched of the organic light emitting diode display device without an external light collecting structure. But if the external light collecting structure is added, the overall thickness of the display device will be increased. Therefore, improving the light directivity of organic light emitting diode displays is one of the goals to be achieved in this technical field.

SUMMARY

At least one embodiment of the present disclosure provides a display device, which can help to improve the light directivity.

The display device according to at least one embodiment of the present disclosure includes a substrate, subpixel units and a thin film encapsulation structure. The subpixel units are disposed on the substrate, and each of the subpixel units includes a light emitting part and a pixel defining part surrounding the light emitting part. The thin film encapsulation structure covers the subpixel units, and includes a first encapsulation layer and a second encapsulation layer covering and in contact with the first encapsulation layer. The refractive index of the first encapsulation layer is different from the refractive index of the second encapsulation layer. The first encapsulation layer includes first microstructures, and the first microstructures are respectively disposed on the pixel defining parts. The second encapsulation layer includes second microstructures, the second microstructures are respectively disposed on the pixel defining parts, and the second microstructures are respectively fitted with the first microstructures to form distributed Bragg reflectors.

The display device according to at least another embodiment of the present disclosure includes a substrate, subpixel units and a thin film encapsulation structure. The subpixel units are disposed on the substrate, and each of the subpixel units includes a light emitting part and a pixel defining part surrounding the light emitting part. The thin film encapsulation structure covers the subpixel units, and includes a thin film encapsulation layer disposed on the subpixel units, a first encapsulation layer disposed on the thin film encapsulation layer and a second encapsulation layer covering and in contact with the first encapsulation layer. The refractive index of the first encapsulation layer is different from the refractive index of the second encapsulation layer. The first encapsulation layer includes first microstructures, and the first microstructures are respectively disposed on the pixel defining parts. The second encapsulation layer includes second microstructures, the second microstructures are respectively disposed on the pixel defining parts, and the second microstructures are respectively fitted with the first microstructures to form distributed Bragg reflectors.

DETAILED DESCRIPTION

Figure 1:
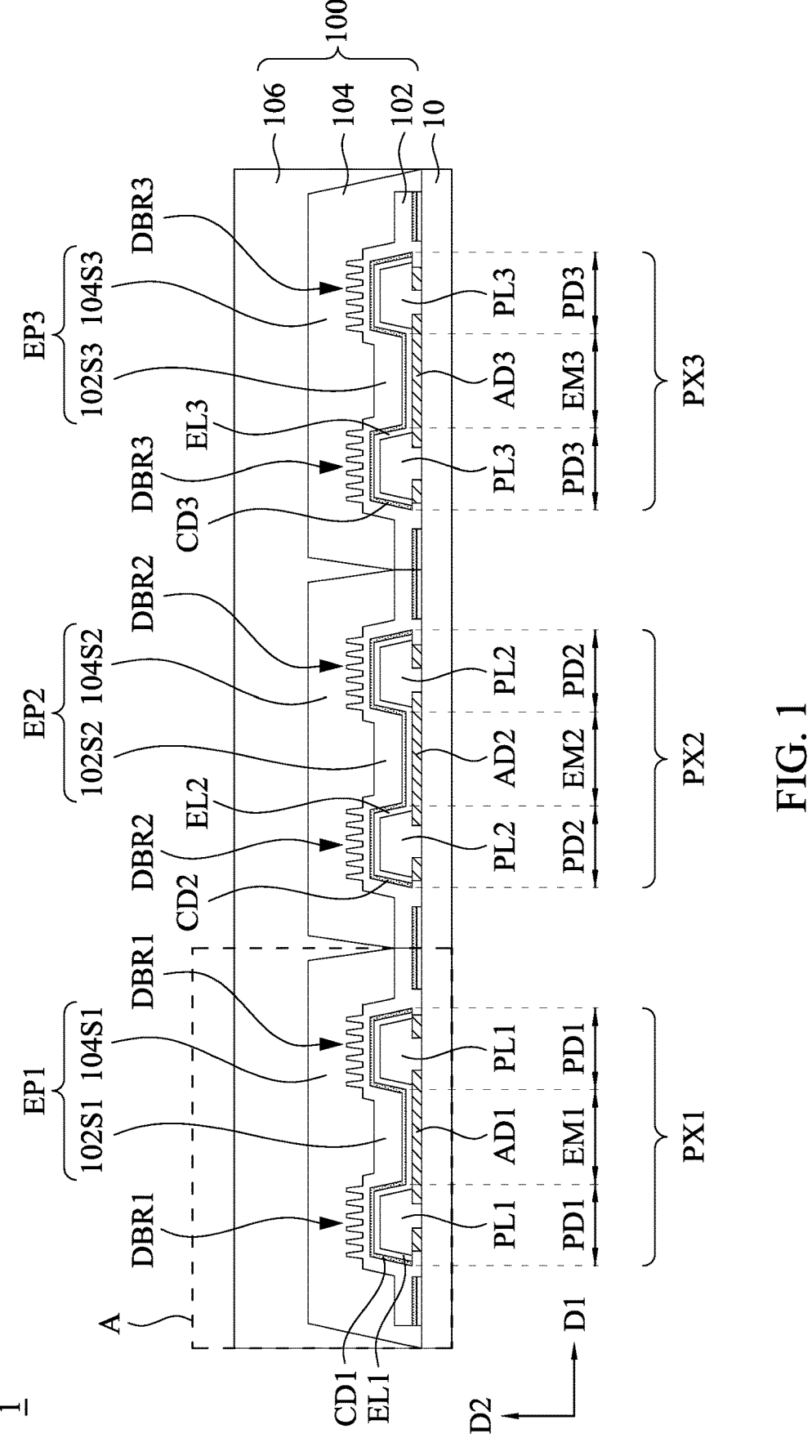
FIG. 1 is a schematic cross-sectional view of a display device according to at least one embodiment of the present disclosure.

In the following description, in order to clearly present the technical features of the present disclosure, the dimensions (such as length, width, thickness, and depth) of elements (such as layers, films, substrates, and areas) in the drawings will be enlarged in unequal proportions. Therefore, the description and explanation of the following embodiments are not limited to the sizes and shapes presented by the elements in the drawings, but should cover the sizes, shapes, and deviations of the two due to actual manufacturing processes and/or tolerances. For example, the flat surface shown in the drawings may have rough and/or non-linear characteristics, and the acute angle shown in the drawings may be round. Therefore, the elements presented in the drawings in this case are mainly for illustration, and are not intended to accurately depict the actual shape of the elements, nor are they intended to limit the scope of patent applications in this case.

Furthermore, the words "about", "approximately" or "substantially" used in the present disclosure not only cover the clearly stated numerical values and numerical ranges, but also cover those that can be understood by a person with ordinary knowledge in the technical field to which the present disclosure belongs. The permissible deviation range can be determined by the error generated during measurement, and the error is caused, for example, by limitations of the measurement system or process conditions. For example, two objects (such as the plane or traces of a substrate) are "substantially parallel" or "substantially perpendicular," where "substantially parallel" and "substantially perpendicular," respectively, mean that parallelism and perpendicularity between the two objects can include non-parallelism and non-perpendicularity caused by permissible deviation ranges.

In addition, "about" may mean within one or more standard deviations of the above values, such as within ±30%, ±20%, ±10%, or ±5%. Such words as "about", "approximately", or "substantially" as appearing in the present disclosure may be used to select an acceptable range of deviation or standard deviation according to optical properties, etching properties, mechanical properties, or other properties, rather than applying all of the above optical properties, etching properties, mechanical properties, and other properties with a single standard deviation.

The spatial relative terms used in the present disclosure, such as "below," "under," "above," "on," and the like, are intended to facilitate the recitation of a relative relationship between one element or feature and another as depicted in the drawings. The true meaning of these spatial relative terms includes other orientations. For example, the relationship between one element and another may change from "below" and "under" to "above" and "on" when the drawing is turned 180 degrees up or down. In addition, spatially relative descriptions used in the present disclosure should be interpreted in the same manner.

It should be understood that while the present disclosure may use terms such as "first", "second", "third" to describe various elements or features, these elements or features should not be limited by these terms. These terms are primarily used to distinguish one element from another, or one feature from another. In addition, the term "or" as used in the present disclosure may include, as appropriate, any one or a combination of the listed items in association.

Moreover, the present disclosure may be implemented or applied in various other specific embodiments, and the details of the present disclosure may be combined, modified, and altered in various embodiments based on different viewpoints and applications, without departing from the idea of the present disclosure.

Figure 2:
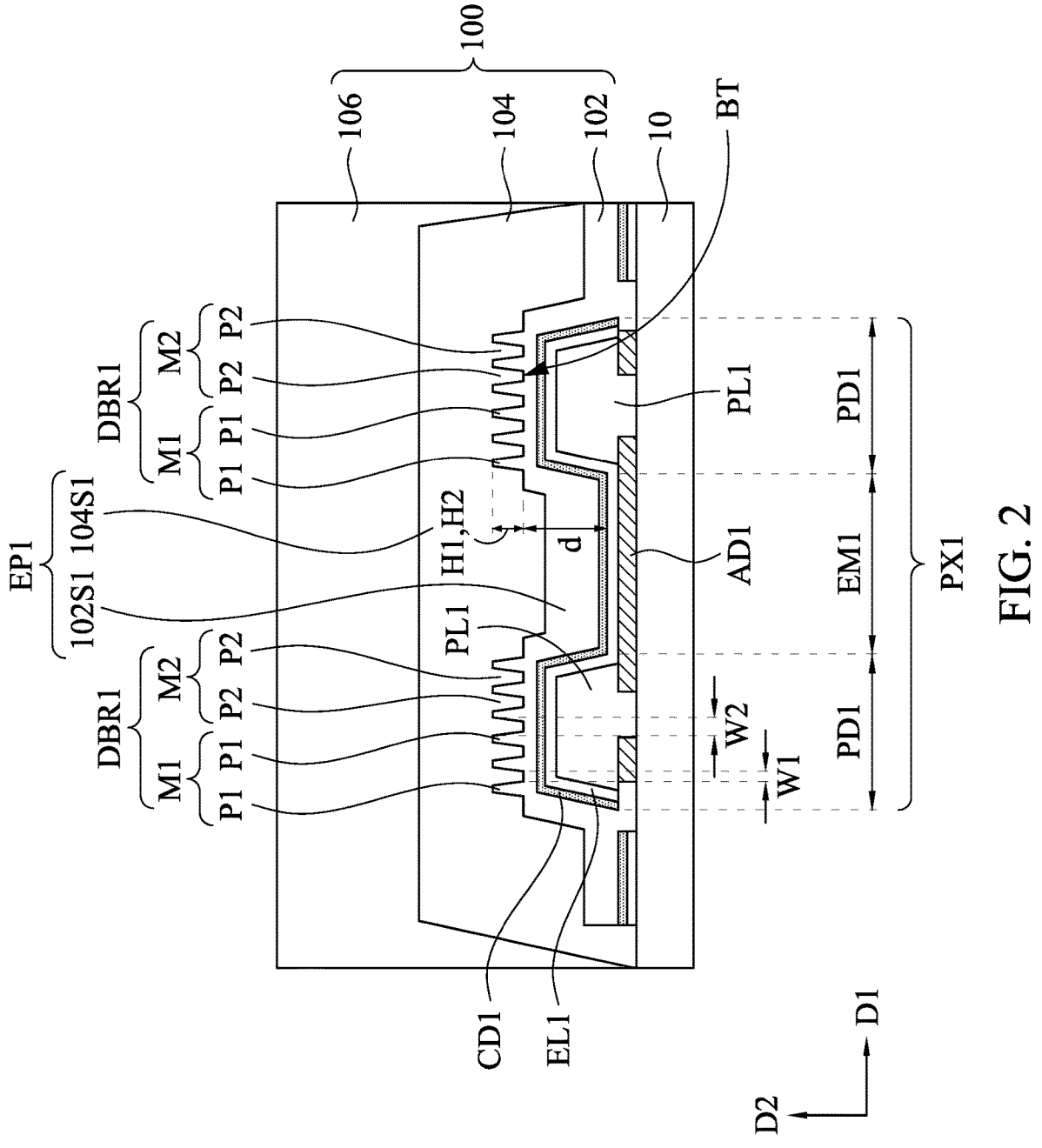
FIG. 2 is an enlarged view of region A in FIG. 1.

FIG. 1 is a schematic cross-sectional view of a display device 1 according to at least one embodiment of the present disclosure. FIG. 2 is an enlarged view of region A in FIG. 1. Referring to FIG. 1 and FIG. 2, the display device 1 includes a substrate 10, subpixel units PX1, PX2, PX3, and a thin film encapsulation structure 100. The subpixel units PX1, PX2, PX3 are disposed on the substrate 10. Each of the subpixel units PX1, PX2, PX3 includes a light emitting part EM1, EM2, EM3 and a pixel defining part PD1, PD2, PD3 surrounding the light emitting part EM1, EM2, EM3.

The thin film encapsulation structure 100 covers the subpixel units PX1, PX2, PX3 and includes a first encapsulation layer 102 and a second encapsulation layer 104. The refractive index of the first encapsulation layer 102 is different from the refractive index of the second encapsulation layer 104. The first encapsulation layer 102 includes first microstructures M1, where the first microstructures M1 are respectively disposed on the pixel defining parts PD1, PD2, PD3. The second encapsulation layer 104 covers and is in contact with the first encapsulation layer 102. The second encapsulation layer 104 includes second microstructures M2, where the second microstructures M2 are respectively disposed on the pixel defining parts PD1, PD2, PD3. The second microstructures M2 are respectively fitted with the first microstructures M1 to form distributed Bragg reflectors DBR1, DBR2, DBR3.

Through the first microstructure M1 of the first encapsulation layer 102 and the second microstructure M2 of the second encapsulation layer 104 that are disposed on the pixel defining portions PD1, PD2, PD3 and fit into each other, where the refractive index of the first encapsulation layer 102 is different from that of the second encapsulation layer 104, so the first microstructure M1 and the second microstructure M2 that fit together can form the distributed Bragg reflectors DBR1, DBR2, DBR3 surrounding the light emitting parts EM1, EM2, EM3. Therefore, by the design of the above-mentioned structure, the lateral light emitted from the light emitting parts EM1, EM2, EM3 can be reflected by the distributed Bragg reflectors DBR1, DBR2, DBR3, and then change the direction of the lateral light, thus improving the light directivity of the display device 1.

As shown in FIG. 1, the subpixel units PX1, PX2, PX3 are sequentially disposed on the substrate 10 in a first direction D1 parallel to the substrate 10. Each of the subpixel units PX1, PX2, PX3 includes a first electrode AD1, AD2, AD3, a pixel defining layer PL1, PL2, PL3, a light emitting layer EL1, EL2, EL3 and a second electrode CD1, CD2, CD3. In a second direction D2 perpendicular to the substrate 10, the first electrodes AD1, AD2, AD3, the pixel defining layers PL1, PL2, PL3, the light emitting layers EL1, EL2, EL3, and the second electrodes CD1, CD2, CD3 are disposed sequentially on the substrate 10, and the thin film encapsulation structure 100 is disposed on the second electrodes CD1, CD2, CD3.

In some embodiments, the subpixel units PX1, PX2, PX3 include a first color light subpixel unit PX1, a second color light subpixel unit PX2, and a third color light subpixel unit PX3. A wavelength of color light emitted by the light emitting part EM1 of the first color light subpixel unit PX1 is different from a wavelength of color light emitted by the light emitting part EM2 of the second color light subpixel unit PX2, and a wavelength of color light emitted by the light emitting part EM3 of the third color light subpixel unit PX3 is different from the wavelength of color light emitted by the light emitting part EM1 of the first color light subpixel unit PX1 and the wavelength of color light emitted by the light emitting part EM2 of the second color light subpixel unit PX2.

For example, the color light emitted by the light emitting part EM1 of the first color light subpixel unit PX1 is red light, the color light emitted by the light emitting part EM2 of the second color light subpixel unit PX2 is green light, and the color light emitted by the light emitting part EM3 of the third color light subpixel unit PX3 is blue light. Compared with a display device in which the color light emitted by the subpixel units is all white light and equipped with a color filter, this above-mentioned embodiment should have better light extraction efficiency, because the luminous efficiency of the white light organic light emitting diode is lower and the light will be absorbed after passing through the color filter.

In some embodiments, the thin film encapsulation structure 100 is divided into a first color light encapsulation section EP1 covering the first color light subpixel unit PX1, a second color light encapsulation section EP2 covering the second color light subpixel unit PX2, and a third color light encapsulation section EP3 covering the third color light subpixel unit PX3. The first color light encapsulation section EP1, the second color light encapsulation section EP2, and the third color light encapsulation section EP3 all include a portion of the first encapsulation layer 102 and a portion of the second encapsulation layer 104. As shown in FIG. 1, the first color light encapsulation section EP1, the second color light encapsulation section EP2, and the third color light encapsulation section EP3 respectively include the first encapsulation segments 102S1, 102S2, 102S3 of the first encapsulation layer 102 and the second encapsulation segments 104S1, 104S2, 104S3 of the second encapsulation layer 104.

In some embodiments, the refractive index of the first encapsulation layer 102 of the first color light encapsulation section EP1 is different from the refractive index of the first encapsulation layer 102 of the second color light encapsulation section EP2, and the refractive index of the first encapsulation layer 102 of the third color light encapsulation section EP3 is different from the refractive index of the first encapsulation layer 102 of the first color light encapsulation section EP1 and the refractive index of the first encapsulation layer 102 of the second color light encapsulation section EP2. In other words, the refractive index of the first encapsulation segment 102S1 of the first color light encapsulation section EP1 is different from the refractive index of the first encapsulation segment 102S2 of the second color light encapsulation section EP2, and the refractive index of the first encapsulation segment 102S3 of the third color light encapsulation section EP3 is different from the refractive index of the first encapsulation segment 102S1 of the first color light encapsulation section EP1 and the refractive index of the first encapsulation segment 102S2 of the second color light encapsulation section EP2.

In some embodiments, the refractive index of the second encapsulation layer 104 of the first color light encapsulation section EP1 is different from the refractive index of the second encapsulation layer 104 of the second color light encapsulation section EP2, and the refractive index of the second encapsulation layer 104 of the third color light encapsulation section EP3 is different from the refractive index of the second encapsulation layer 104 of the first color light encapsulation section EP1 and the refractive index of the second encapsulation layer 104 of the second color light encapsulation section EP2. In other words, the refractive index of the second encapsulation segment 104S1 of the first color light encapsulation section EP1 is different from the refractive index of the second encapsulation segment 104S2 of the second color light encapsulation section EP2, and the refractive index of the second encapsulation segment 104S3 of the third color light encapsulation section EP3 is different from the refractive index of the second encapsulation segment 104S1 of the first color light encapsulation section EP1 and the refractive index of the second encapsulation segment 104S2 of the second color light encapsulation section EP2.

By selecting the first encapsulation layer 102 and the second encapsulation layer 104 with different refractive indices for each of the first color light encapsulation section EP1, the second color light encapsulation section EP2 and the third color light encapsulation section EP3, so that the distributed Bragg reflectors DBR1, DBR2, and DBR3 suitable for reflecting color light of different wavelengths emitted by the first color light subpixel unit PX1, the second color light subpixel unit PX2, and the third color light subpixel unit PX3 can be designed to enhance the light directivity of the first color light subpixel unit PX1, the second color light subpixel unit PX2, and the third color light subpixel unit PX3, and thus improving the entire light directivity of the display device 1.

However, it should be noted that in other embodiments, the display device 1 may also include multiple subpixel units that emit light of three or more colors. For example, in addition to the above-mentioned first color light subpixel unit PX1, second color light subpixel unit PX2 and third color light subpixel unit PX3, the display device 1 may further include a fourth color light subpixel unit emitting white light or yellow light.

In some embodiments, the light emitting layers EL1, EL2, EL3 may include electroluminescent layers. These electroluminescent layers may have structures of light emitting diodes being electrically connected to the first electrodes AD1, AD2, AD3 and the second electrodes CD1, CD2, CD3, and then emit light. For example, each of the electroluminescent layers may include an electron transport layer, an electron injection layer, a hole transmission layer, and a hole injection layer, and at least one of the electron transport layer, the electron injection layer, the hole transmission layer, and the hole injection layer may be made of an organic material. In other words, each of the electroluminescent layers may be substantially an organic light emitting diode. In addition, each of the electroluminescent layers may be substantially a quantum dot light emitting diode (QLED).

In some embodiments, the material of the pixel defining layers PL1, PL2, PL3 may include a photoresist. In some embodiments, the material of the first electrodes AD1, AD2, AD3 may include a metal, such as aluminum, molybdenum, titanium, copper, silver, or a combination thereof. In some embodiments, the second electrodes CD1, CD2, CD3 may include a metal layer with thin thickness so that the second electrodes CD1, CD2, CD3 allow visible light to transmit. Alternatively, the second electrodes CD1, CD2, CD3 may include a transparent conductive layer, and the material of the transparent conductive layer may include indium tin oxide (ITO), indium zinc oxide (IZO), aluminum tin oxide (ATO), aluminum zinc oxide (AZO), indium germanium zinc oxide (IGZO), or a combination thereof.

Referring to FIG. 1, in the second direction D2, the thin film encapsulation structure 100 not only includes the first encapsulation layer 102 and the second encapsulation layer 104 stacked in sequence, but also includes a thin film encapsulation layer 106 disposed on the second encapsulation layer 104. In some embodiments, the refractive index of the first encapsulation layer 102 and the refractive index of the second encapsulation layer 104 are respectively in a range from 1.1 to 2.0 (including end values). In some embodiments, the first encapsulation layer 102 and the thin film encapsulation layer 106 may respectively include an inorganic layer, and the material of the inorganic layer may include nitrides or oxides, such as silicon nitride, silicon oxide or aluminum oxide. The second encapsulation layer 104 may include an organic layer, and the material of the organic layer may include polymer material, such as acrylic resin, epoxy resin, siloxane or photoresist. By selecting the refractive indices and the materials of the above-mentioned encapsulation layers, the distributed Bragg reflectors can have better reflectivity for visible light.

In some embodiments, a deposition process, an inkjet process, a printing process, a coating process, a photolithography process, and an etching process can be used to form the subpixel units PX1, PX2, PX3 and the thin film encapsulation structure 100 on the substrate 10. It should be noted that compared with the evaporation process using fine metal masks, the subpixel units formed by the photolithography process and the etching process can have smaller pixel sizes, such as less than 10 μm, which are more suitable for applications in augmented reality display devices and virtual reality display devices. In addition, the evaporation process using the fine metal mask usually disposes a spacer layer on the pixel defining layer to support the fine metal mask, and then the thin film encapsulation structure is formed on the spacer layer. If the thickness of the spacer layer is too large, resulting in an increase in the perpendicular distance between the thin film encapsulation structure and the light emitting parts, the reflecting efficiency of the distributed Bragg reflectors of the thin film encapsulation structure for the lateral light emitted by the light emitting parts may be reduced.

Referring to FIG. 2, the first microstructure M1 of the first encapsulation layer 102 includes first protrusions P1, the second microstructure M2 of the second encapsulation layer 104 includes second protrusions P2. The width W1 of each first protrusion P1 and the width W2 of each second protrusion P2 are respectively in a range from 1 nm to 1 μm (including end values), and the height H1 of each first protrusion P1 and the height H2 of each second protrusion P2 are respectively in a range from 1 μm to 10 μm (including end values). Through the design of the above-mentioned widths, the distributed Bragg reflectors can have better reflectivity for visible light.

Specifically, in the first direction D1 parallel to the substrate 10, each first protrusion P1 has a width W1 and each second protrusion P2 has a width W2. The width W1 and the width W2 are respectively in a range from 1 nm to 1 μm. In the second direction D2 perpendicular to the substrate 10, each first protrusion P1 has a height H1 and each second protrusion P2 has a height H2, and the height H1 and the height H2 are respectively in a range from 1 μm to 10 μm.

In addition, the first microstructure M1 has a bottom BT. In the second direction D2 perpendicular to the substrate 10, the distance d between the bottom BT of the first microstructure M1 and the light emitting layer EL1 located in the light emitting part EM1 is in a range from 0.5 μm to 3 μm (including end value). Through the design of the above-mentioned distance, the distributed Bragg reflectors can have better reflection efficiency for the lateral light emitted by the light emitting part.

As shown in FIG. 2, the first protrusions P1 of the first microstructure M1 are arranged at intervals on the pixel defining part PD1, the second protrusions P2 of the second microstructure M2 are arranged at intervals on the pixel defining part PD1, and the first protrusions P1 and the second protrusions P2 are fitted with each other to form the distributed Bragg reflector DBR1 surrounding the light emitting part EM1, i.e., the first protrusions P1 and the second protrusions P2 are complementary with each other and staggered on the pixel defining part PD1.

In some embodiments, the first microstructure M1 including the first protrusions P1 on the pixel defining part PD1 is formed by etching the first encapsulation layer 102, and then the second encapsulation layer 104 is filled in the spaces between the first protrusions P1 to form the second microstructure M2 of the second encapsulation layer 104 on the pixel defining part PD1, where the first microstructure M1 and the second microstructure M2 are fitted with each other to form the distributed Bragg reflector DBR1 surrounding the light emitting part EM1.

In some embodiments, the width W1 of each first protrusion P1 of the first encapsulation layer 102 of the first color light encapsulation section EP1 is different from the width W1 of each first protrusion P1 of the first encapsulation layer 102 of the second color light encapsulation section EP2, and the width W1 of each first protrusion P1 of the first encapsulation layer 102 of the third color light encapsulation section EP3 is different from the width W1 of each first protrusion P1 of the first encapsulation layer 102 of the first color light encapsulation section EP1 and the width W1 of each first protrusion P1 of the first encapsulation layer 102 of the encapsulation section EP2.

In other words, the width W1 of each first protrusion P1 of the first encapsulation segment 102S1 of the first color light encapsulation section EP1 is different the width W1 of each first protrusion P1 of the first encapsulation segment 102S2 of the second color light encapsulation section EP2, and the width W1 of each first protrusion P1 of the first encapsulation segment 102S3 of the third color light encapsulation section EP3 is different from the width W1 of each first protrusion P1 of the first encapsulation segment 102S1 of the first color light encapsulation section EP1 and the width W1 of each first protrusion P1 of the first encapsulation segment 102S2 of the second color light encapsulation section EP2.

In some embodiments, the width W2 of each second protrusion P2 of the second encapsulation layer 104 of the first color light encapsulation section EP1 is different from the width W2 of each second protrusion P2 of the second encapsulation layer 104 of the second color light encapsulation section EP2, and the width W2 of each second protrusion P2 of the second encapsulation layer 104 of the third color light encapsulation section EP3 is different from the width W2 of each second protrusion P2 of the second encapsulation layer 104 of the first color light encapsulation section EP1 and the width W2 of each second protrusion P2 of the second encapsulation layer 104 of the encapsulation section EP2.

In other words, the width W2 of each second protrusion P2 of the second encapsulation segment 104S1 of the first color light encapsulation section EP1 is different the width W2 of each second protrusion P2 of the second encapsulation segment 104S2 of the second color light encapsulation section EP2, and the width W2 of each second protrusion P2 of the second encapsulation segment 104S3 of the third color light encapsulation section EP3 is different from the width W2 of each second protrusion P2 of the second encapsulation segment 104S1 of the first color light encapsulation section EP1 and the width W2 of each second protrusion P2 of the second encapsulation segment 104S2 of the second color light encapsulation section EP2.

By designing the first protrusions P1 and the second protrusions P2 with different widths for each of the first color light encapsulation section EP1, the second color light encapsulation section EP2 and the third color light encapsulation section EP3, so that the distributed Bragg reflectors DBR1, DBR2, and DBR3 suitable for reflecting color light of different wavelengths emitted by the first color light subpixel unit PX1, the second color light subpixel unit PX2, and the third color light subpixel unit PX3 can be designed to enhance the light directivity of the first color light subpixel unit PX1, the second color light subpixel unit PX2, and the third color light subpixel unit PX3, and thus improving the entire light directivity of the display device 1.

Figure 3B:
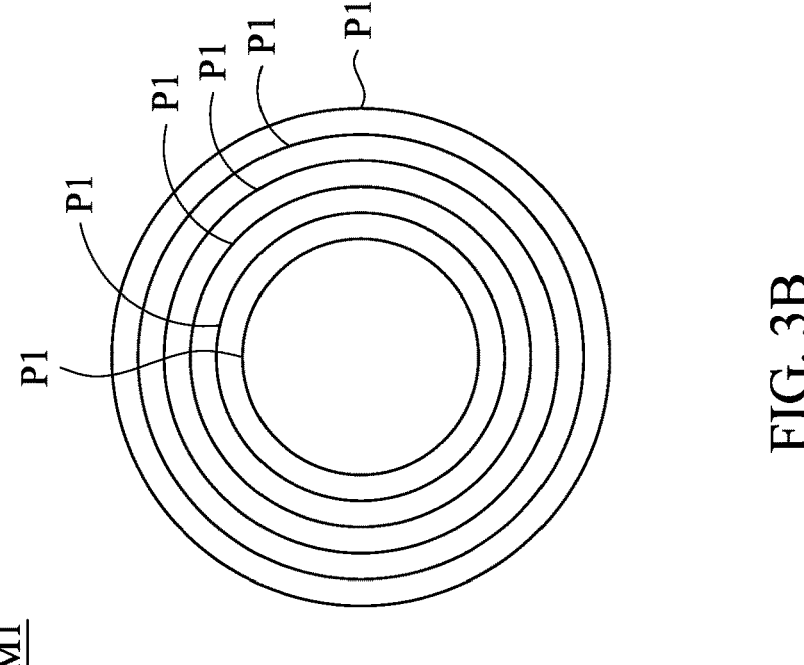
FIG. 3B is a schematic top view of a first microstructure according to at least another embodiment of the present disclosure.
Figure 3A:
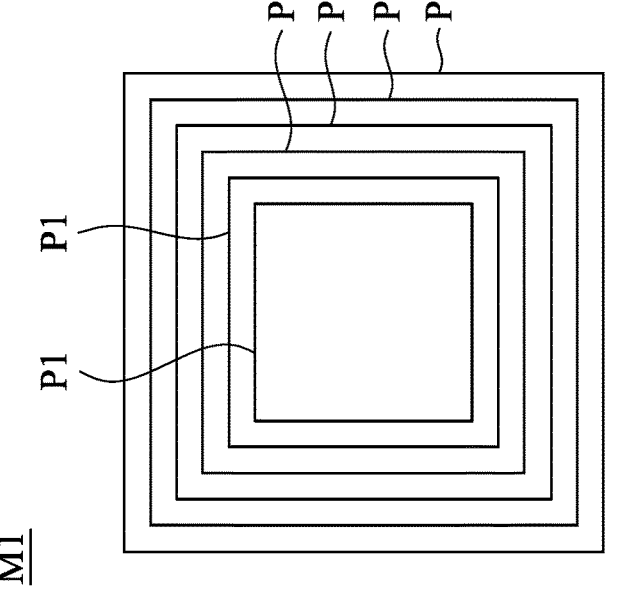
FIG. 3A is a schematic top view of a first microstructure according to at least one embodiment of the present disclosure.

FIG. 3A is a schematic top view of a first microstructure according to at least one embodiment of the present disclosure. FIG. 3B is a schematic top view of a first microstructure according to at least another embodiment of the present disclosure. Referring to FIG. 3A and FIG. 3B, the top view shape of each first protrusion P1 of the first microstructure M1 may include a square or a circle, but is not limited thereto. In other embodiments, the top view shape of each first protrusion P1 of the first microstructure M1 may include a polygon or an ellipse.

Figure 4:
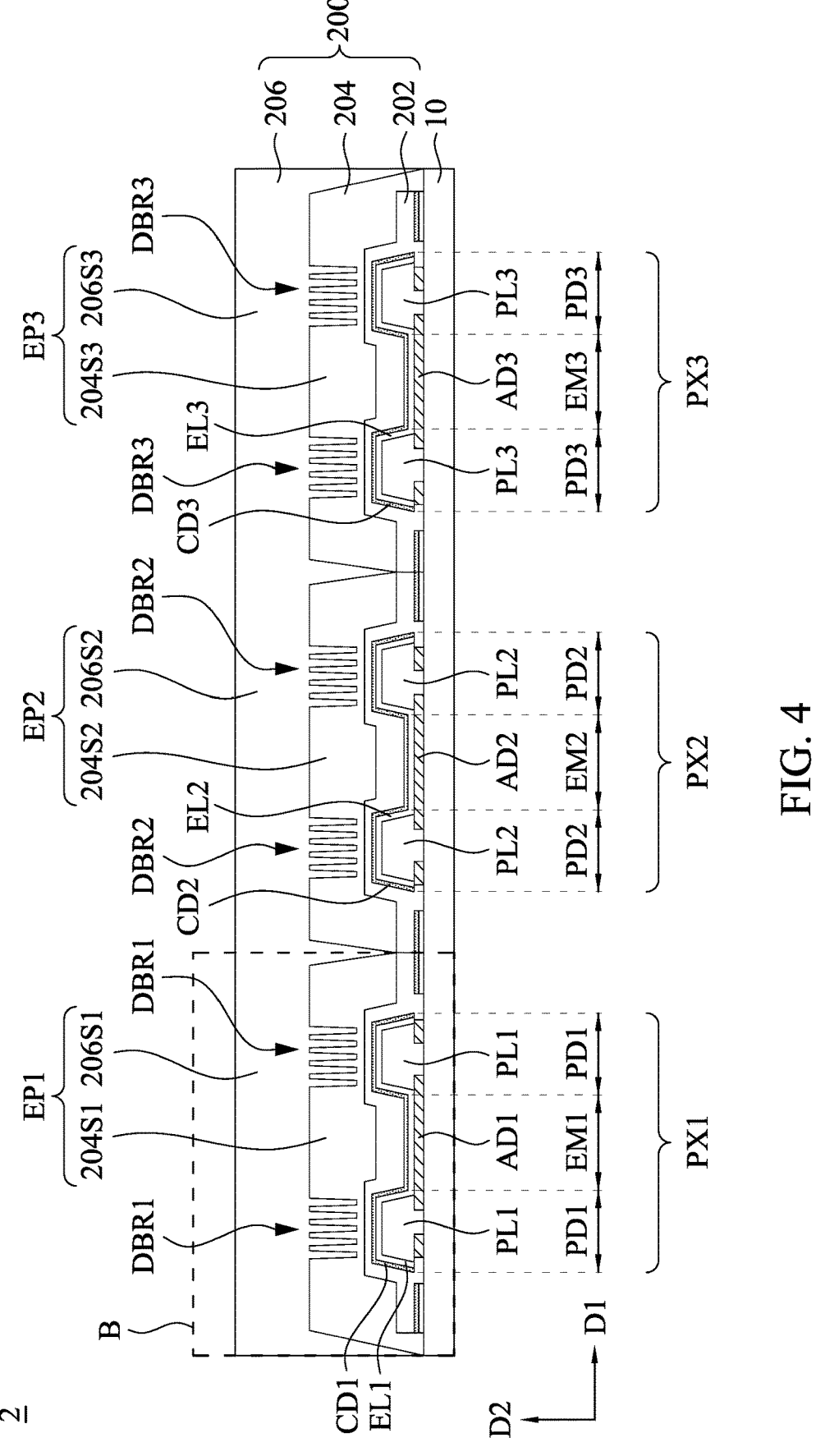
FIG. 4 is a schematic cross-sectional view of a display device according to at least another embodiment of the present disclosure.
Figure 5:
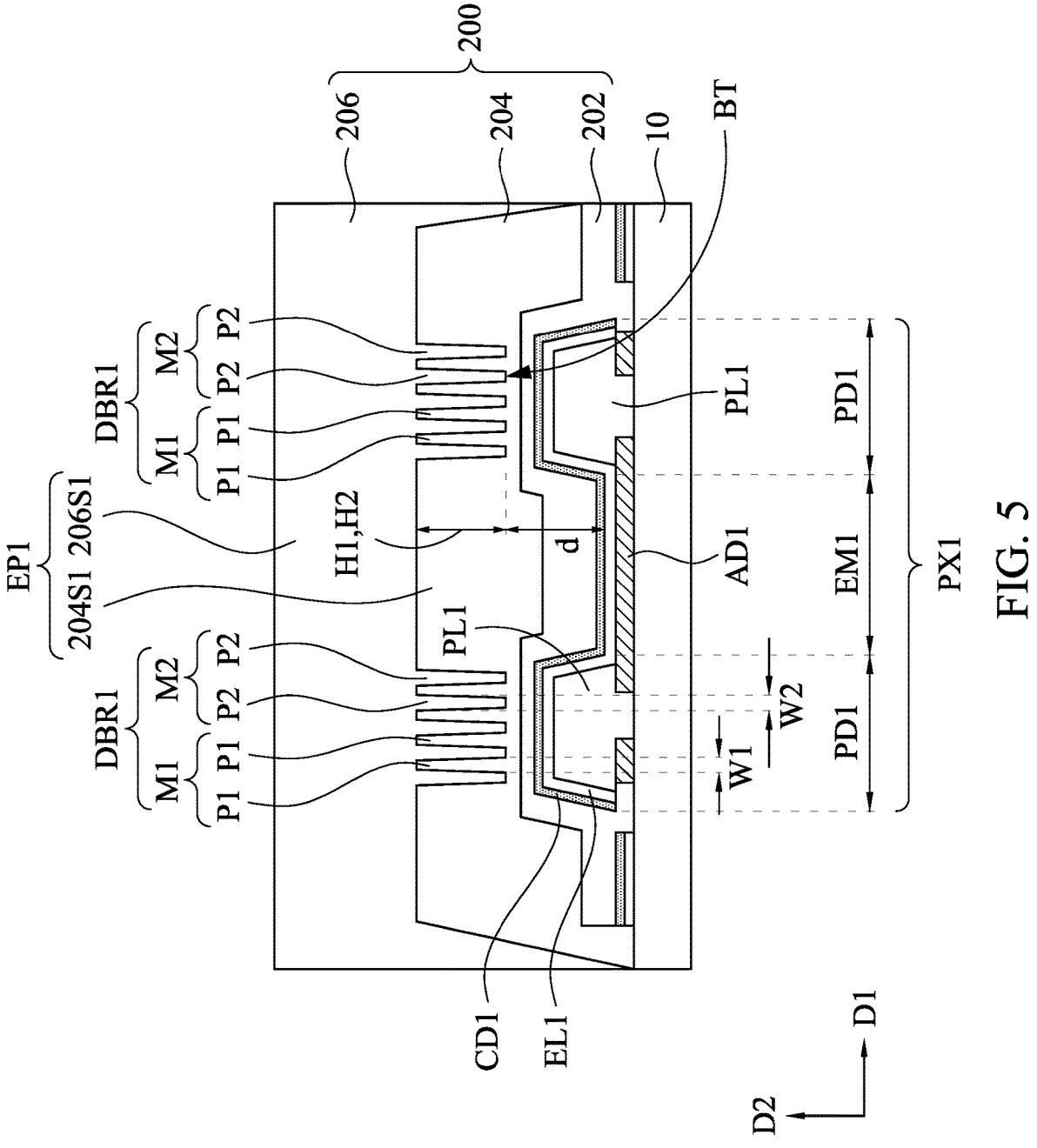
FIG. 5 is an enlarged view of region B in FIG. 4.

FIG. 4 is a schematic cross-sectional view of a display device according to at least another embodiment of the present disclosure. FIG. 5 is an enlarged view of region B in FIG. 4. The structures, the materials, the manufacturing processes and the relative positions of most elements in the embodiment of FIG. 4 and FIG. 5 and the embodiment of FIG. 1 and FIG. 2 are the same, so the same features are not repeated here. The difference between the embodiment of FIG. 4 and FIG. 5 and the embodiment of FIG. 1 and FIG. 2 is that the thin film encapsulation structure 200 of the display device 2 includes a thin film encapsulation layer 202 disposed between the subpixel units PX1, PX2, PX3 and the first encapsulation layer 204.

In detail, as shown in FIG. 4, the thin film encapsulation layer 202, the first encapsulation layer 204 and the second encapsulation layer 206 of the thin film encapsulation structure 200 of the display device 2 are sequentially disposed on the subpixel units PX1, PX2, PX3 in the second direction D2. In addition, the thin film encapsulation structure 200 is divided into a first color light encapsulation section EP1 covering the first color light subpixel unit PX1, a second color light encapsulation section EP2 covering the second color light subpixel unit PX2, and a third color light encapsulation section EP3 covering the third color light subpixel unit PX3.

The first color light encapsulation section EP1, the second color light encapsulation section EP2 and the third color light encapsulation section EP3 respectively include the first encapsulation segments 204S1, 204S2, 204S3 of the first encapsulation layer 204 and the second encapsulation segments 206S1, 206S2, 206S3 of the second encapsulation layer 206. However, the structures and the relative positions of the first encapsulation layer 204 and the second encapsulation layer 206 of the display device 2 and the first encapsulation layer 102 and the second encapsulation layer 104 of the display device 1 are the same, so the same features are not repeated here.

The material of the first encapsulation layer 204 is the same as the material of the second encapsulation layer 104 of the thin film encapsulation structure 100 of the display device 1, and the material of the second encapsulation layer 206 is the same as the material of the thin film encapsulation layer 106 of the thin film encapsulation structure 100 of the display device 1, and the refractive index of the first encapsulation layer 204 is different from the refractive index of the second encapsulation layer 206. In addition, the material of the thin film encapsulation layer 202 is the same as the material of the first encapsulation layer 102 of the thin film encapsulation structure 100 of the display device 1.

In some embodiments, the first microstructure M1 including the first protrusions P1 on the pixel defining part PD1 is formed by etching the first encapsulation layer 204, and then the second encapsulation layer 206 is filled in the spaces between the first protrusions P1 to form the second microstructure M2 of the second encapsulation layer 206 on the pixel defining part PD1, where the first microstructure M1 and the second microstructure M2 are fitted with each other to form the distributed Bragg reflector DBR1 surrounding the light emitting part EM1.

In summary, in at least one embodiment of the display device of the present disclosure, the thin film encapsulation structure includes the first encapsulation layer and the second encapsulation layer with different refractive indices, and the first microstructure of the first encapsulation layer and the second microstructure of the second encapsulation layer are fitted with each other on the pixel defining part to form the distributed Bragg reflector surrounding the light emitting part, so that the lateral light emitted from the light emitting part changes the direction through the reflection of the distributed Bragg reflector, and then the light directivity of display device is improved.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims.

What is claimed is:

1. A display device, comprising:
a substrate;
a plurality of subpixel units, disposed on the substrate, wherein each of the subpixel units comprises a light emitting part and a pixel defining part surrounding the light emitting part; and
a thin film encapsulation structure, covering the subpixel units, wherein the thin film encapsulation structure comprises:
a first encapsulation layer, comprising a plurality of first microstructures, wherein the first microstructures are respectively disposed on the pixel defining parts; and
a second encapsulation layer, covering and in contact with the first encapsulation layer, wherein a refractive index of the first encapsulation layer is different from a refractive index of the second encapsulation layer, and the second encapsulation layer comprises a plurality of second microstructures respectively disposed on the pixel defining parts, wherein the second microstructures are respectively fitted with the first microstructures to form a plurality of distributed Bragg reflectors.

2. The display device of claim 1, wherein each of the first microstructures comprises a plurality of first protrusions, and each of the second microstructures comprises a plurality of second protrusions, wherein a width of each of the first protrusions and a width of each of the second protrusions are respectively in a range from 1 nm to 1 μm.

3. The display device of claim 2, wherein a height of each of the first protrusions and a height of each of the second protrusions are respectively in a range from 1 μm to 10 μm.

4. The display device of claim 1, wherein each of the first microstructures has a bottom, and each of the subpixel units comprises a light emitting layer, wherein a distance between the bottom and the light emitting layer located in the light emitting part is in a range from 0.5 μm to 3 μm in a direction perpendicular to the substrate.

5. The display device of claim 1, wherein the refractive index of the first encapsulation layer and the refractive index of the second encapsulation layer are respectively in a range from 1.1 to 2.0.

6. The display device of claim 1, wherein one of the first encapsulation layer and the second encapsulation layer comprises an inorganic layer, and the other one of the first encapsulation layer and the second encapsulation layer comprises an organic layer.

7. The display device of claim 1, wherein the subpixel units comprises a first color light subpixel unit and a second color light subpixel unit, and a wavelength of color light emitted by the light emitting part of the first color light subpixel unit is different from a wavelength of color light emitted by the light emitting part of the second color light subpixel unit, wherein the thin film encapsulation structure is divided into:
a first color light encapsulation section, covering the first color light subpixel unit; and
a second color light encapsulation section, covering the second color light subpixel unit, wherein the first color light encapsulation section and the second color light encapsulation section both comprise a portion of the first encapsulation layer and a portion of the second encapsulation layer.

8. The display device of claim 7, wherein the refractive index of the first encapsulation layer of the first color light encapsulation section is different form the refractive index of the first encapsulation layer of the second color light encapsulation section.

9. The display device of claim 7, wherein each of the first microstructures comprises a plurality of first protrusions, and a width of each of the first protrusions of the first encapsulation layer of the first color light encapsulation section is different form a width of each of the first protrusions of the first encapsulation layer of the second color light encapsulation section.

10. The display device of claim 7, wherein the refractive index of the second encapsulation layer of the first color light encapsulation section is different form the refractive index of the second encapsulation layer of the second color light encapsulation section.

11. The display device of claim 7, wherein each of the second microstructures comprises a plurality of second protrusions, and a width of each of the second protrusions of the second encapsulation layer of the first color light encapsulation section is different form a width of each of the second protrusions of the second encapsulation layer of the second color light encapsulation section.

12. The display device of claim 1, wherein the thin film encapsulation structure further comprises a thin film encapsulation layer disposed on the second encapsulation layer.

13. The display device of claim 12, wherein the thin film encapsulation layer and the first encapsulation layer respectively comprise an inorganic layer, and the second encapsulation layer comprises an organic layer.

14. The display device of claim 1, wherein each of the first microstructures comprises a plurality of first protrusions, and a top view shape of each of the first protrusions of the first microstructure is a square or a circle.

15. A display device, comprising:

a substrate;

a plurality of subpixel units, disposed on the substrate, wherein each of the subpixel units comprises a light emitting part and a pixel defining part surrounding the light emitting part; and a thin film encapsulation structure, covering the subpixel units, wherein the thin film encapsulation structure comprises:

a thin film encapsulation layer, disposed on the subpixel units;

a first encapsulation layer, disposed on the thin film encapsulation layer and comprising a plurality of first microstructures, wherein the first microstructures are respectively disposed on the pixel defining parts; and a second encapsulation layer, covering and in contact with the first encapsulation layer, wherein a refractive index of the first encapsulation layer is different from a refractive index of the second encapsulation layer, and the second encapsulation layer comprises a plurality of second microstructures respectively disposed on the pixel defining parts, wherein the second microstructures are respectively fitted with the first microstructures to form a plurality of distributed Bragg reflectors.

16. The display device of claim 15, wherein the thin film encapsulation layer and the second encapsulation layer respectively comprise an inorganic layer, and the first encapsulation layer comprises an organic layer.

17. The display device of claim 15, wherein each of the first microstructures comprises a plurality of first protrusions, and each of the second microstructures comprises a plurality of second protrusions, wherein a width of each of the first protrusions and a width of each of the second protrusions are respectively in a range from 1 nm to 1 μm.

18. The display device of claim 17, wherein a height of each of the first protrusions and a height of each of the second protrusions are respectively in a range from 1 μm to 10 μm.

19. The display device of claim 15, wherein each of the first microstructures has a bottom, and each of the subpixel units comprises a light emitting layer, wherein a distance between the bottom and the light emitting layer located in the light emitting part is in a range from 0.5 μm to 3 μm in a direction perpendicular to the substrate.

20. The display device of claim 15, wherein the refractive index of the first encapsulation layer and the refractive index of the second encapsulation layer are respectively in a range from 1.1 to 2.0.

\* \* \* \* \*